(12) United States Patent
Murphy

(10) Patent No.: US 7,763,371 B2
(45) Date of Patent: Jul. 27, 2010

(54) SOLID OXIDE FUEL CELL ELECTROLYTE AND METHOD

(75) Inventor: Kenneth S. Murphy, Norton Shores, MI (US)

(73) Assignee: Howmet Corporation, Cleveland, OH (US)

( * ) Notice: Subject to any disclaimer, the term of this patent is extended or adjusted under 35 U.S.C. 154(b) by 1392 days.

(21) Appl. No.: 11/099,416

(22) Filed: Apr. 5, 2005

(65) Prior Publication Data

US 2006/0222922 A1 Oct. 5, 2006

(51) Int. Cl.
*H01M 8/10* (2006.01)
*H01M 2/08* (2006.01)
*C23C 16/00* (2006.01)
*B05D 3/00* (2006.01)
*B05D 1/36* (2006.01)

(52) U.S. Cl. ............... 429/30; 429/35; 427/255.28; 427/294; 427/419.2

(58) Field of Classification Search ............ 429/35, 429/30; 427/255.28
See application file for complete search history.

(56) References Cited

U.S. PATENT DOCUMENTS

| | | | |
|---|---|---|---|
| 3,645,786 A * | 2/1972 | Tannenberger et al. ...... | 427/596 |
| 4,686,158 A | 8/1987 | Nishi et al. .................. | 429/26 |
| 4,937,152 A | 6/1990 | Sato et al. .................... | 429/30 |
| 5,213,911 A | 5/1993 | Bloom et al. ................. | 429/33 |
| 5,277,938 A | 1/1994 | Wegmann et al. ............ | 427/566 |
| 5,601,652 A * | 2/1997 | Mullin et al. .......... | 118/723 EB |
| 5,716,720 A * | 2/1998 | Murphy ....................... | 428/623 |
| 5,741,406 A | 4/1998 | Barnett et al. ........... | 204/192.15 |
| 5,773,078 A * | 6/1998 | Skelly ...................... | 427/126.3 |
| 5,932,368 A | 8/1999 | Batawi et al. ................. | 429/30 |
| 5,985,476 A | 11/1999 | Wachsman et al. ............ | 429/33 |
| 6,007,683 A | 12/1999 | Jankowski et al. ...... | 204/192.17 |
| 6,232,009 B1 | 5/2001 | Batawi ......................... | 429/40 |
| 6,645,656 B1 | 11/2003 | Chen et al. .................... | 429/32 |
| 6,673,130 B2 | 1/2004 | Jankowski et al. .......... | 29/623.5 |
| 6,677,070 B2 | 1/2004 | Kearl ........................... | 429/33 |
| 6,688,254 B2 | 2/2004 | Callaway et al. ............. | 118/723 |
| 6,692,855 B1 | 2/2004 | Aizawa et al. ................. | 429/30 |
| 6,956,012 B2 * | 10/2005 | Paranthaman et al. ....... | 505/434 |
| 2004/0096572 A1 | 5/2004 | Chen et al. ................... | 427/115 |
| 2004/0101729 A1 | 5/2004 | Kearl ........................... | 429/30 |

FOREIGN PATENT DOCUMENTS

GB    1 252 254    11/1971

* cited by examiner

*Primary Examiner*—Patrick Ryan
*Assistant Examiner*—Karie O'Neill Apicella

(57) ABSTRACT

A method of making a solid oxide fuel cell electrolyte includes preheating a substrate on which an oxide electrolyte layer is to be deposited to a substrate temperature of about 1100° C. and above, impinging a surface of a source comprising the oxide with an electron beam in an evacuated chamber at a pressure of about $10^{-3}$ or less mm of Hg devoid of process gas, such as oxygen, to evaporate the oxide in the chamber, and placing the preheated substrate in the chamber where the oxide deposits on the preheated substrate. The oxide fuel cell electrolyte is deposited having a columnar oxide microstructure.

10 Claims, 6 Drawing Sheets

SOLID OXIDE FUEL CELL ELECTROLYTE AND METHOD

FIELD OF THE INVENTION

The present invention relates to a solid oxide electrolyte for a fuel cell and to method of making such a solid oxide electrolyte using electron beam physical vapor deposition.

BACKGROUND OF THE INVENTION

A solid oxide fuel cell (SOFC) comprises an anode to which fuel (e.g. hydrogen gas) is delivered, a solid oxide electrolyte, and cathode to which oxygen (e.g. air) is delivered. An illustrative anode comprises a NiO-yttria stabilized zirconia (YSZ) mixture. An illustrative electrolyte comprises solid yttria stabilized zirconia (YSZ). An illustrative cathode comprises a lanthanum-strontium manganate mixture (LSM). A dense (nonporous) oxide electrolyte is necessary to provide a seal between the hydrogen fuel anode and oxygen in air at the cathode since leakage through the electrolyte reduces efficiency of the fuel cell.

The solid oxide electrolyte has been made as a thin film or layer by a number of processing methods including electron beam physical vapor deposition (EBPVD) such as described in U.S. Pat. No. 3,645,786 and British Patent 1 252 254. U.S. Pat. No. 3,645,786 describes deposition rates of only about 1 micron/minute and indicates that deposition rates of greater than 1.5 microns/minute yield electrolyte layers having mechanical stresses, which may cause breaking of the electrolyte layer.

British Patent 1 252 254 requires a gas atmosphere of a pressure of $10^{-1}$ to $10^{-2}$ mm of Hg during deposition of a solid electrolyte. For example, a helium gas atmosphere of $4 \times 10^{-2}$ mm of Hg was used to deposit a glazed YSZ oxide layer on a nickel substrate at a deposition rate of about 1.5 microns/minute.

Other patents which describe EBPVD of solid oxide electrolyte as layers include U.S. Pat. Nos. 4,937,152; 5,932,368; 6,007,683; 6,673,130; 6,677,070; and published US application No US 2004/0096572 A1.

U.S. Pat. No. 5,741,406 describes radio-frequency sputtering of a dense YSZ electrolyte at a deposition rate of only about 4 microns/minute.

U.S. Pat. No. 5,716,720 describes an EB PVD method of depositing a columnar thermal barrier oxide coating layer on a substrate using a process gas (e.g. oxygen) introduced during deposition and coating parameters controlled to form a columnar coating microstructure that includes required intentional internal porosity to accommodate strain mismatch between a metallic substrate and the thermal barrier coating layer.

SUMMARY OF THE INVENTION

The present invention provides a method of making an oxide layer for a fuel cell by electron beam physical vapor deposition at high deposition rates and provides a solid oxide electrolyte so produced.

Pursuant to an illustrative embodiment of the invention, the method involves heating a substrate on which a solid oxide electrolyte layer is to be deposited to a substrate temperature of about 1100° C. and above, impinging a surface of a source comprising the oxide with an electron beam in an evacuated chamber at a pressure of about $10^{-3}$ or less mm of Hg devoid of process gas, such as oxygen, to evaporate the oxide in the chamber, and depositing the oxide on the heated substrate in the chamber as a solid oxide electrolyte layer.

Pursuant to another illustrative embodiment of the invention, an oxide fuel cell electrolyte is provided having a columnar oxide microstructure.

Pursuant to still another illustrative embodiment of the invention, a fuel cell is provided comprising an anode, cathode, and an oxide electrolyte between the anode and the cathode wherein the electrolyte has a microstructure comprising a plurality of oxide columns. The oxide columns extend in a direction transverse to facing surfaces of the anode and the cathode.

Advantages, features, and embodiments of the present invention will become apparent from the following description.

DESCRIPTION OF THE INVENTION

The present invention provides a method of making an oxide layer for a fuel cell by electron beam physical vapor deposition at high deposition rates of at least 10 microns/minute and to the solid oxide electrolyte produced thereby. The method of the invention can be practiced in one illustrative embodiment using the apparatus described in U.S. Pat. No. 5,716,720, the teachings of which are incorporated herein by reference, although the invention is not limited to practice using that apparatus since other EB PVD apparatus can be used.

Pursuant to an illustrative embodiment of the invention, the method involves preheating a substrate on which the oxide layer is to be deposited to a substrate temperature of about 1100° C. and above, impinging a surface of a source comprising the oxide preferably by scanning the top surface with an electron beam in an evacuated coating chamber at a pressure of about $10^{-3}$ or less mm of Hg, the chamber being devoid of process gas, such as oxygen, argon, helium, or nitrogen, to evaporate the oxide in the chamber, and placing the preheated substrate in the chamber where the oxide deposits on the preheated substrate. Process gas means any gas that is intentionally introduced into the working volume of the coating apparatus from outside of the coating apparatus. The only gas(es) present in the coating chamber during coating are those outgassed from the substrate manipulator, heater elements, substrate support tooling, internal surfaces of the coating apparatus, radiant heater, melting ceramic of the ingot, and substrates to be coated, such outgassing being responsible for the low pressure of about $10^{-3}$ or less mm of Hg present in the chamber during coating.

Figure 1:
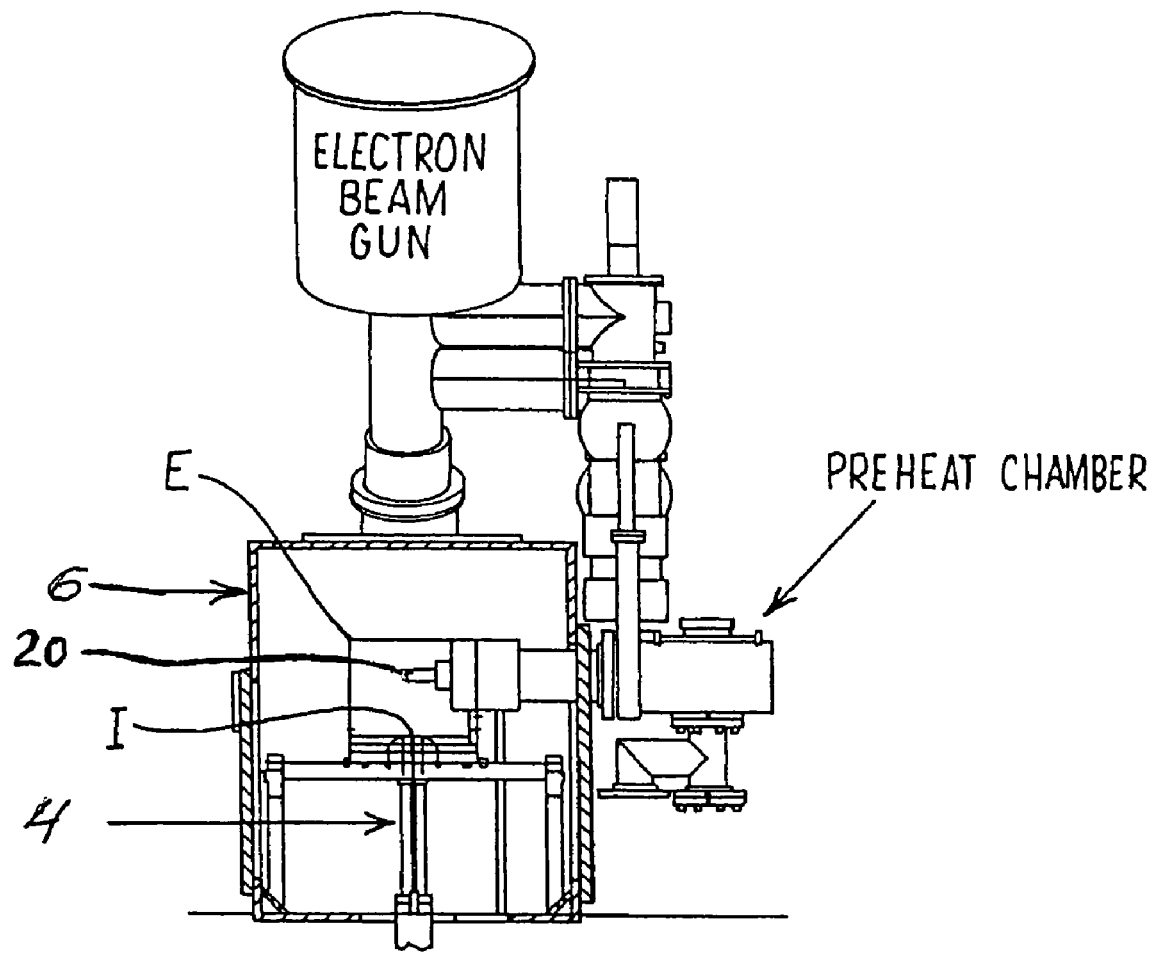
FIG. 1 is a schematic drawing of an EB PVD apparatus for practicing an illustrative embodiment of the invention.
Figure 7:
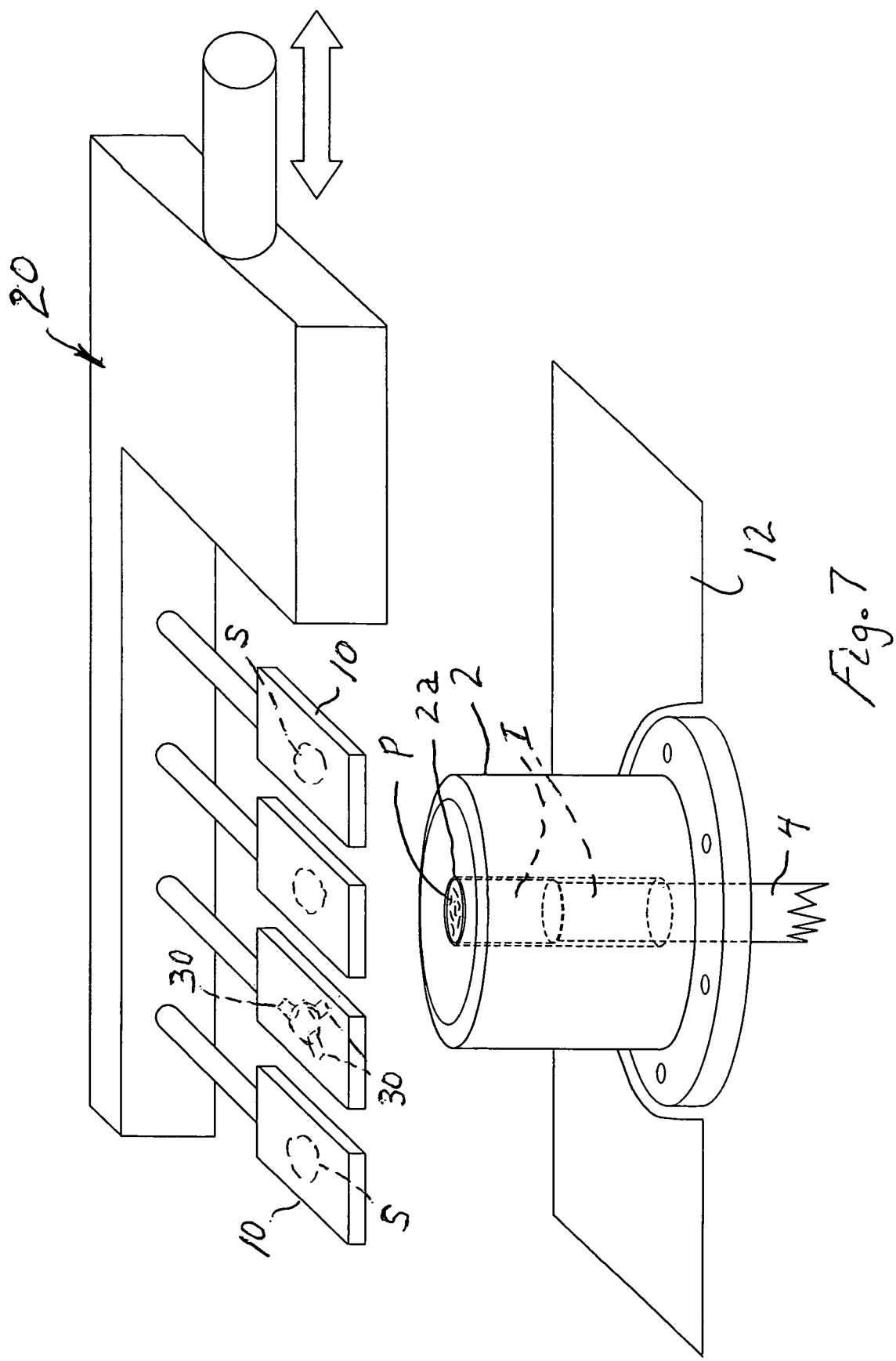
FIG. 7 is a perspective view of a copper hearth and liquid ceramic pool with a part manipulator in position to locate substrates over the pool for depositing the oxide electrolyte.

An illustrative embodiment of the invention can be practiced using the EB PVD apparatus of the type described in U.S. Pat. No. 5,716,720, which is incorporated herein by reference. In such apparatus as illustrated in FIGS. 1 and 7, a source of the oxide to be deposited is provided in the form an ingot I fed through an upstanding passage 2a of water cooled copper ingot hearth 2 so that an electron beam from the electron beam gun is directed at and scans the top surface of the ingot I to heat the ingot to form a liquid cermaic pool P on the top surface and evaporate the oxide material from the pool. Referring to FIG. 7, the ingot is supported by other ingots (one shown) below it, and the bottom ingot is supported by a controllable feed ram (ingot pusher) 4.

The top surface of the ingot is exposed in a heat reflective enclosure E in and communicating to the coating chamber 6, FIG. 1. The enclosure E includes an opening through which the electron beam can pass to impinge on the ingot and a movable temperature control lid (not shown) as described in U.S. Pat. No. 6,319,569, which is incorporated herein by reference. The evaporated oxide material is condensed on preheated substrates S, FIG. 7, positioned on respective holding tools 10 of a part manipulator 20 held in stationary position in the enclosure E of the coating chamber so that the surfaces of the substrate S to be coated are generally above and face the top surface of the ingot I (oxide source). Additional ingot sources of the oxide can be used in the enclosure E as needed depending on the number of substrates to be coated. The part manipulator is movable in the directions of the arrows in FIG. 7 to allow loading of the substrates on the holding tools 10 of the part manipulator 20 in a load lock (not shown), position substrates S above the ingot I, and then to remove the substrates after the oxide electrolyte is deposited thereon. In laboratory testing, the substrates S were held on the respective holding tools 10 by metal tabs 30 tack welded on the holding tools 120 degrees apart and overlapping the substrates to hold them on the tools when the substrates face the pool P, although any other substrate mounting means can be employed in practice of the invention in a laboratory context or production context. The substrates are preheated in a preheat chamber to a substrate temperature of about 1100° C. and above as described later. This substrate preheating temperature is higher than the substrate preheating temperature employed in U.S. Pat. No. 5,716,720 to deposit thermal barrier coatings having intentional intercolumnar porosity on aerospace components to enhance their thermal barrier resistance.

For example, the substrate(s) is/are mounted on respective holding tools 10 attached to the part manipulator 20 initially residing in a load chamber (not shown). An access door to the load chamber is closed, and the load chamber is evacuated to about $1\times10^{-2}$ mm Hg. The load chamber is connected to the preheat chamber by a gate valve.

The gate valve is opened so that the part manipulator 20 can be moved to a preheat station or position in the preheat chamber. The preheat chamber and the coating chamber 6 are first evacuated to below about $1\times10^{-4}$ mm of Hg before the gate valve is opened.

Before the part manipulator is moved to the preheat chamber, the heating sources of the preheat chamber are at an idle temperature of about 530° C. prior to activating the heater ramp to about 1100° C. The substrate(s) on the part manipulator 20 then is/are preheated to a substrate temperature of about 1100° C. and above by a resistance graphite type of heater in the preheat chamber. A rapid ramp of the heater can be used to allow the substrate(s) to reach the selected preheat temperature in about 8 minutes or other time depending upon the heater ramp setting. The substrates are then soaked (held) at the preheat temperature for a time to ensure uniform temperature of the substrates S and the holding tools 10. Although the preheat chamber and coating chamber were evacuated to $1\times10^{-4}$ torr, outgassing of the part manipulator, holding tool, heater components, internal coating chamber surfaces, melting ceramic of the ingot, and substrates causes the pressure to rise to a pressure of about $10^{-3}$ or less mm of Hg. The only gas(es) present in the preheat chamber and coating chamber are those outgassed from the part manipulator, holding tool, heater components, internal coating chamber surfaces, melting ceramic of the ingot, and substrates to be coated. That is, such outgassing is responsible for the pressure of about $10^{-3}$ or less mm of Hg present in the preheat chamber and coating chamber during coating. Importantly, the preheat chamber and the coating chamber are devoid of any process gas, such as oxygen, which is intentionally introduced into the coating chamber in practice of U.S. Pat. No. 5,716,720 to deposit thermal barrier coatings on aerospace components. Process gas means any gas that is intentionally introduced into the working volume of the coating apparatus from outside of the coating apparatus.

While the coating chamber is waiting for the substrate(s) to be moved thereto by the part manipulator, the electron beam from the electron beam gun is scanned on a non-consumable target (not shown), such as for example graphite or yttria stabilized zirconia nuggets, disposed about the copper hearth 2 in the enclosure E at a beam power (e.g. 80 kW) with scanning to heat, not melt, the non-consumable target material, which in turn provides radiant heating of the enclosure and coating chamber. The target material (nuggets) typically is disposed about the copper hearth on chamber wall 12 to near the top of the copper hearth. A supplemental heating device, such as resistance and/or radiant heater, can be provided in the coating chamber 6 and/or enclosure E to this same end in lieu of the scanning of the non-consumable target material. In this way, the coating zone of the enclosure of coating chamber where the substrate(s) reside during coating typically is heated, for example, to a temperature of greater than about 1040° C. The coating zone is typically a region centered above the ingot I, FIG. 7.

Shortly before the preheated substrate(s) are moved through an opening in the enclosure into the coating zone by the part manipulator (e.g. 2 minutes before), the electron beam at appropriate power level is redirected to scan the top surface (6.35 cm diameter) of the ingot I, such as in an illustrative embodiment a yttria stabilized zirconia ingot, to melt the top of the ingot to form the liquid ceramic pool P and evaporate the oxide material from the pool. The liquid ceramic pool P is contained on the sides by the water cooled copper hearth 2 and on the bottom by underlying unmelted ceramic ingot, FIG. 7. For a yttria stabilized zirconia ingot, an electron beam power level of 80 to 90 kW can be used although beam power and beam scanning pattern are usually selected relative to one another in a trade off manner to produce acceptable melting, feed rate, and deposition temperature. For example, melting of the ingot I can be achieved at 70 kW when using an aggressive scan pattern on the ingot, but the temperature is not high enough to produce the densest microstructure. Use of a scanning electron beam allows control of the evaporation rate by adjusting the beam scanning pattern and power level of the electron beam. The ingot typically is fed at a rate of 3 to 4 inches per hour, although any ingot feed rate or zero ingot feed rate can be used depending on the deposition time needed for the oxide electrolyte layer.

Once the substrate(s) are preheated to the desired temperature and stable evaporation is achieved from the pool P, the manipulator 20 moves the substrate(s) S to the coating zone in the central region of the enclosure of the coating chamber above the pool P. The substrates remain stationary at the coating zone for a time required to deposit the desired layer thickness of oxide electrolyte thereon at a rate of deposition of at least 10 microns of oxide layer thickness per minute achievable using the above described parameters.

The invention envisions modifying the apparatus of FIG. 1 to provide a magazine of multiple substrates to be coated with the oxide electrolyte layer to provide a larger substrate loading capacity. A larger preheat chamber could be provided to preheat a plurality of the substrate magazines concurrently, wile multiple electron beam guns are used to melt and evaporate oxide material from multiple ingots positioned in the coating chamber to increase output of the coating chamber. The substrate magazines could be moved through a inline coating apparatus from a load station, to an inline preheat station, to an inline coating station, to an inline cooling station, and then to inline unloading station. Such an inline arrangement would permit the substrates to be input into one end of the coating apparatus and removed from the other end providing near continuous substrate flow through the coating apparatus. Additionally, the process is not limited to only the electrolyte oxide. Any oxide, for example the LSM described below, can be deposited in the manner to achieve a dense coating.

The following Examples are offered for purposes of illustrating but not limiting the invention.

EXAMPLES

The coating apparatus described above was used to deposit an oxide electrolyte layer on multiple anode substrates comprising disks, FIG. 7, made by screen printing and sintering a mixture of NiO-YSZ, the anode disks having an anode size of 0.5 inches diameter by 0.030 inch thick to provide disk-shape specimens to examine. The oxide electrolyte layer comprised zirconia stabilized with 7 weight % yttria (7YSZ). The anode substrates were mounted on respective holding tools 10 attached to the part manipulator 20 in the load chamber. The anode substrates were exposed to the pool P of the ingot in the enclosure of the coating position (facing down), FIG. 7. The manipulator was "homed" to this position. The load lock access door was closed. The motion program of the part manipulator was set to 0 RPM when the anode substrate is moved to the coating position in the enclosure of the coating chamber such that the substrate is held stationary during coating at the coating position where the substrates were held above the ingot I with their surfaces requiring the oxide electrolyte facing the ingot I.

The gate valve between the load chamber and the coating chamber was opened, and the manipulator was moved to the preheat station in the preheat chamber. The preheat chamber and coating chamber were evacuated to below about $1 \times 10^{-4}$ mm of Hg. The preheat heater, idling at 530° C., was set to reach its set point temperature in about 8 minutes. The preheater held the set point temperature for an additional 6 minutes. These ramp rates, set point temperatures, and hold times can be altered to match the load mass for more efficient processing. Although the preheat chamber and coating chamber were evacuated to $1 \times 10^{-4}$ torr (mm of Hg), outgassing of the manipulator, holding tool, heater components, hot ingot, and substrates caused the pressure therein to rise to a pressure of about $10^{-3}$ or less mm of Hg. The outgassing was solely responsible for the pressure of about $10^{-3}$ or less mm of Hg present in the preheat chamber and coating chamber during coating. The preheat chamber and the coating chamber thus were devoid of any process gas, such as oxygen, which is intentionally introduced into the coating chamber in practice of U.S. Pat. No. 5,716,720 to deposit thermal barrier coatings on aerospace components.

While the enclosure of the coating chamber was waiting for the substrate(s) to be moved thereto by the part manipulator, the electron beam from the electron beam gun was scanned in a rectangular raster pattern on a non-consumable target (e.g. nuggets of 7YSZ) in the enclosure of the coating chamber at a beam power (e.g. 85-95 kW) to heat the non-consumable target material, which in turn provided radiant heating of the coating chamber to provide a central coating working zone temperature of greater than about 1035° C. Approximately 2 minutes before the preheat operation was completed, the electron beam scanning at the same power level was redirected to the top surface of a 7YSZ ingot I and the scanning pattern changed to produce a liquid pool of the 7YSZ material on the top surface of the 7YSZ ingot. The water cooled copper hearth and unmelted ingot contained the liquid from which the 7YSZ material was evaporated. The ingot was fed upwardly at 3 to 4 inches per hour while being impinged with the electron beam.

Once the substrate(s) were preheated to the desired temperature and stable evaporation was achieved from the ingot I in the enclosure of the coating chamber, the part manipulator moved the substrate(s) S to the coating zone in the central region of the enclosure of the coating chamber. The substrates remained stationary at the coating zone spaced about 35 cm above the ingot I for a time required to deposit the desired layer thickness of oxide electrolyte thereon. For example, a 7YSZ electrolyte layer was deposited on the anode substrates to a thickness of 10-20 microns (target of 15 microns) in approximately 80 seconds. As mentioned above, the coating chamber was devoid of any process gas, such as oxygen.

Once the desired oxide electrolyte thickness was deposited on the anode substrates, the part manipulator was moved to the load chamber and the gate valve was closed to permit the substrates to cool in the load chamber. Argon was introduced into the load chamber to increase cooling of the hot substrates and part manipulator. Once the substrates were sufficiently cool (e.g. less than 260° C.), the chamber was brought to atmospheric pressure and the chamber was opened. The holding tool was removed from the part manipulator, and the coated substrates were removed from the holding tool.

Figure 3:
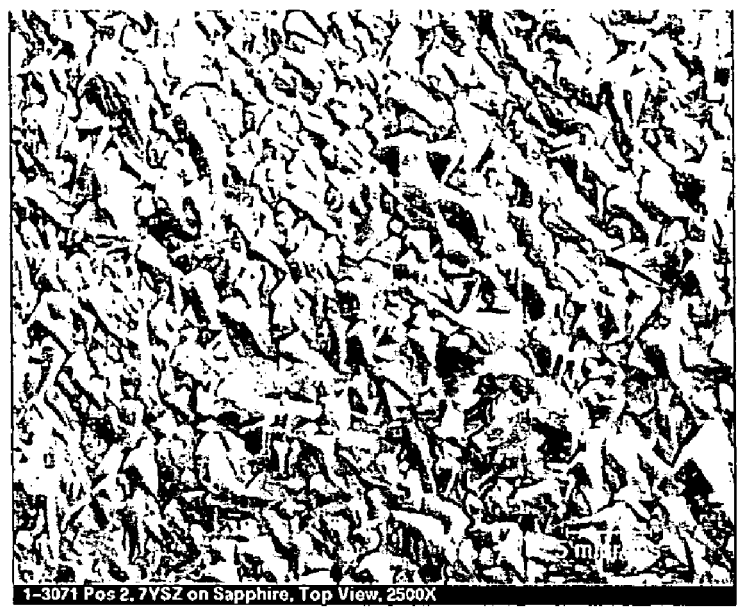
FIG. 3 is a photomicrograph of a top surface of the oxide electrolyte pursuant to an illustrative embodiment of the invention.
Figure 4:
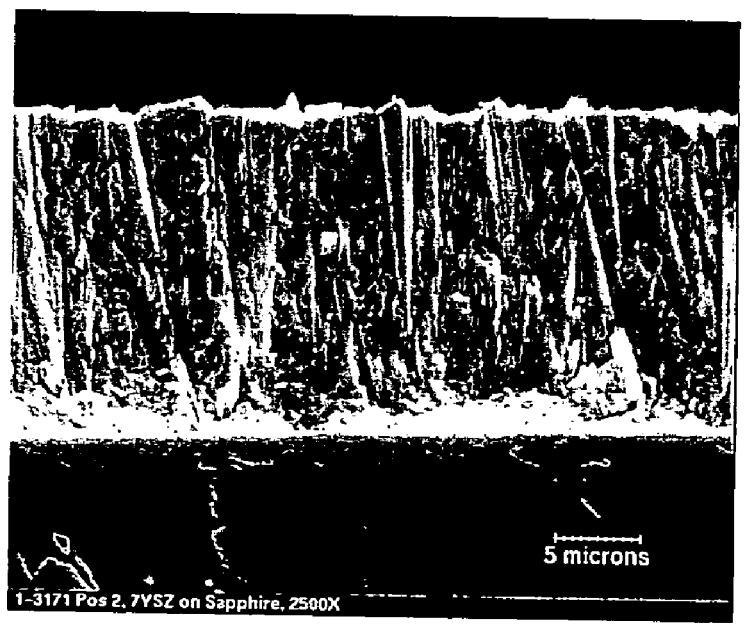
FIG. 4 is a photomicrograph of a transverse cross section of the oxide electrolyte of FIG. 3.

FIG. 3 is a photomicrograph at 2500× of a top surface of a representative 7YSZ electrolyte deposited using the above parameters. FIG. 4 is a photomicrograph at 2500× of the transverse cross section of the oxide electrolyte of FIG. 3. These figures show an oxide electrolyte layer microstructure comprising relatively large, densely packed columns of 7YSZ material. The tips of the columns have a "roof-top" shape. The oxide columns extend in a direction transverse to facing surfaces of the anode and the cathode. The deposited 7YSZ electrolyte layer comprises the tetragonal-prime phase of zirconia. Inspection of the back surface of witness sapphire samples (present in the coating chamber with the anode substrates) showed a "black" mirror-like reflectivity. When similar substrates are coated with aerospace TBC conditions, the back surface is cloudy white.

Figure 2:
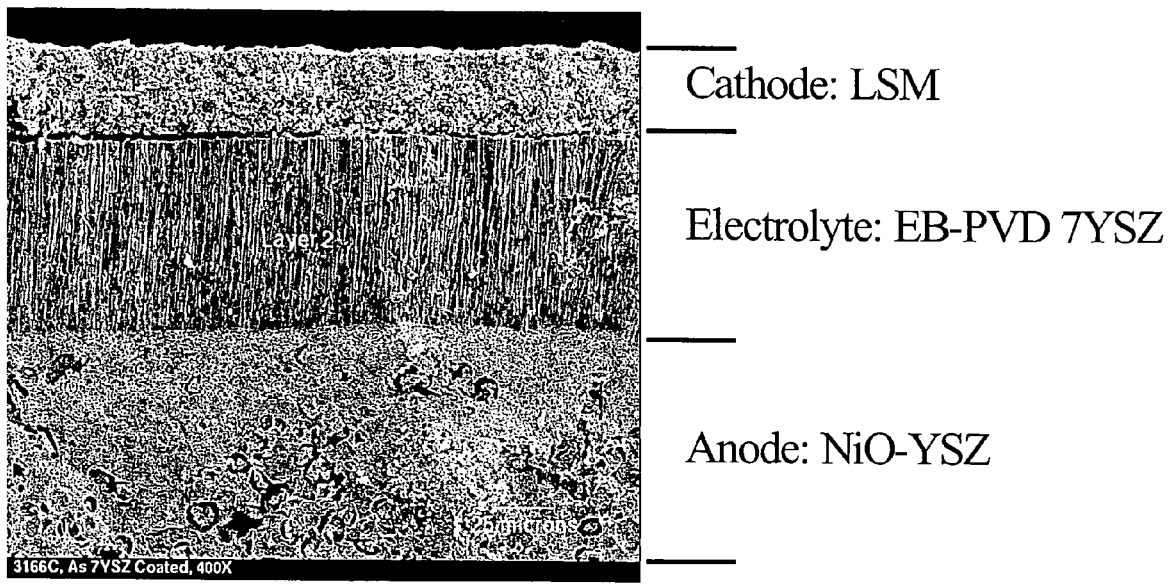
FIG. 2 is a photomicrograph of a fuel cell pursuant to an illustrative embodiment of the invention wherein the photomicrograph is taken of a transverse cross section of the fuel cell.

FIG. 2 is a photomicrograph of a fuel cell specimen made pursuant to another illustrative embodiment of the invention wherein the photomicrograph is taken of a transverse cross section of the fuel cell specimen and shows a lanthanum-strontium manganate (LSM) cathode layer deposited by the screen printing method on the 7YSZ electrolyte layer. The 7YSZ layer was deposited on the NiO-YSZ anode as described above to a thickness of about 75 microns. The photomicrograph was obtained after fracturing the fuel cell layers.

FIG. 2 reveals integrity at the interface between the EB-PVD 7YSZ electrolyte layer and the anode layer, evidencing integral bonding between the electrolyte layer and the anode layer. There are no gaps or separations even after fracturing the anode, electrolyte and cathode layers. The 7YSZ electrolyte layer appears to be dense enough to provide a gas (hydrogen) seal. The interface between the 7YSZ electrolyte layer and the cathode layer does show separations after fracturing. Applying the cathode layer may improve the integrity of this interface after fracturing.

Figure 5B:
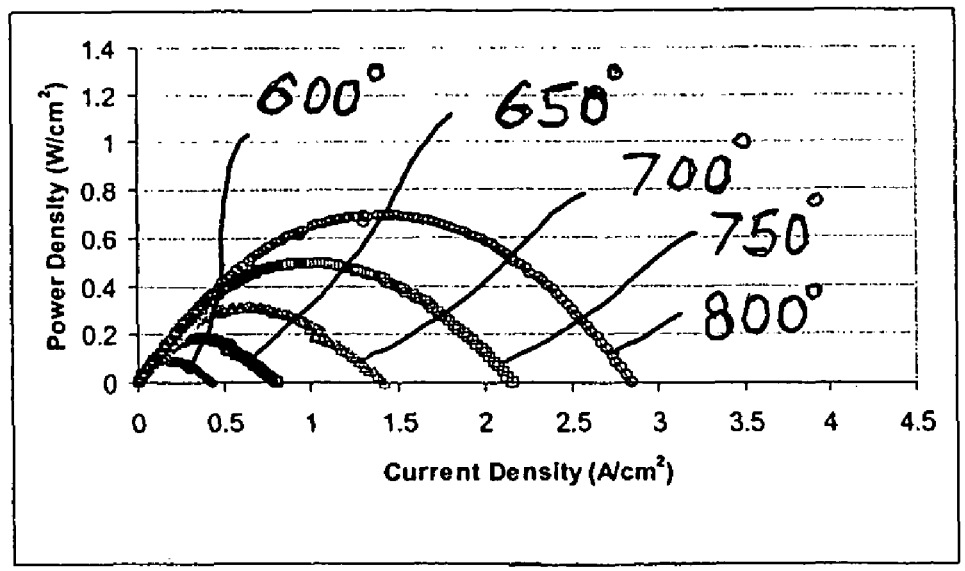
FIGS. 5A and 5B are graphs of terminal voltage and power density, respectively, of a fuel cell specimen pursuant to the invention as a function of temperature of 600, 650, 700, 750, and 800 degrees C.
Figure 5A:
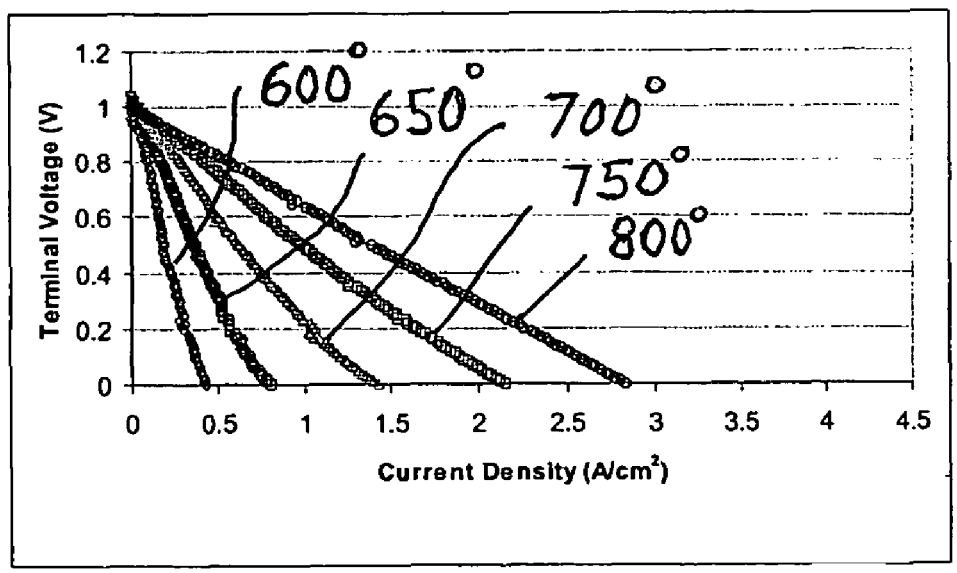

Fuel cell specimens were made similar to FIG. 4 but to provide a 7YSZ solid oxide electrolyte having a thickness of about 18 microns. FIGS. 5A and 5B are graphs of terminal voltage and power density, respectively, of such a fuel cell specimen shown as a function of temperature of 600, 650, 700, 750, and 800° C. As shown in FIG. 5B, the maximum power output was about 0.70 W/cm$^2$ at 800° C.

Figure 6B:
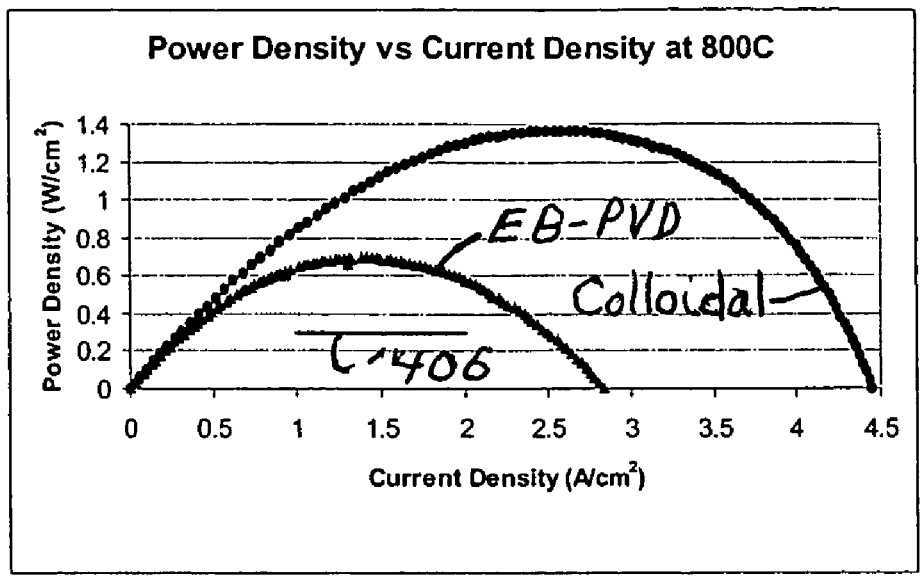
FIGS. 6A and 6B are graphs of terminal voltage versus power density of the fuel cell specimen (designated "EB-PVD") pursuant to the invention compared to similar data for a colloidal deposited oxide fuel cell designated "Colloidal" and the fuel cell reported in U.S. Pat. No. 5,741,406 designated "'406".
Figure 6A:
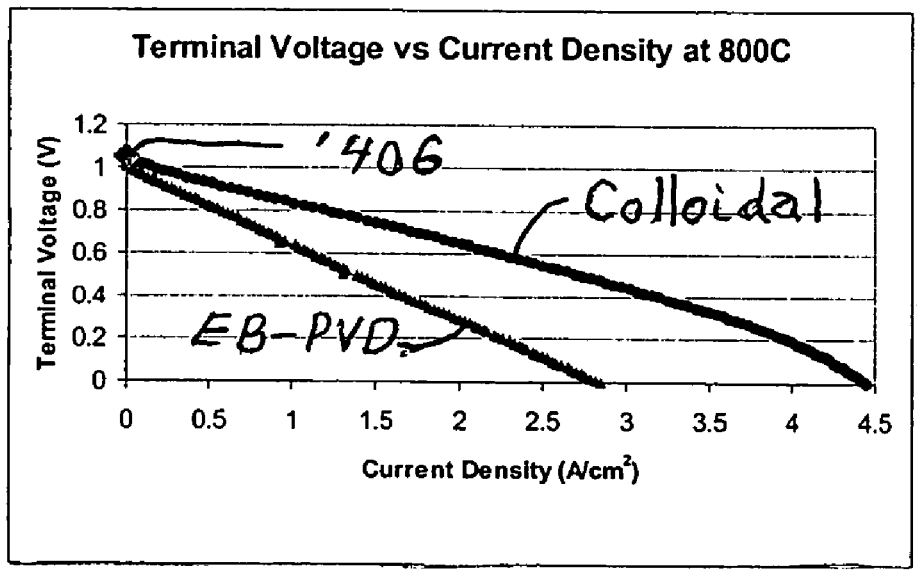

FIGS. 6A and 6B are graphs of terminal voltage versus power density of the fuel cell specimen with the 7YSZ electrolyte having a thickness of about 18 microns (designated "EB-PVD") as compared to similar data for a colloidial deposited solid oxide fuel cell (designated "Collodial") and the fuel cell reported in U.S. Pat. No. 5,741,406 (designated "'406".

The fuel cell specimens made pursuant to above illustrative embodiments of the invention performed better than the '406 fuel cell specimens and exhibited performance below that of the collodial deposited SOFC but still considered successful. Performance of the fuel cell specimens may be improved by reducing the thickness of the oxide electrolyte to 10 microns and increasing density of the oxide electrolyte to reduce hydrogen leakage. Substrate preheating and coating at higher temperatures and slowing deposition of the oxide electrolyte could help to this end.

It should be understood that the invention is not limited to the specific embodiments or constructions described above but that various changes may be made therein without departing from the spirit and scope of the invention as set forth in the appended claims.

I claim:

1. Method of making an oxide fuel cell electrolyte layer, comprising heating a substrate on which the oxide layer is to be deposited to a substrate temperature of about 1100° C. and above, impinging a surface of a source comprising the oxide with an electron beam in a chamber at a pressure of about $10^{-3}$ or less mm of Hg without introducing process gas to evaporate the oxide in the chamber from a liquid pool, and depositing oxide on the heated substrate in the chamber where the oxide deposits on the heated substrate to form the oxide fuel cell electrolyte layer.

2. The method of claim 1 wherein the oxide layer is formed on the anode or cathode of the fuel cell.

3. The method of claim 1 wherein the oxide deposits at a rate of at least 10 microns thickness/minute.

4. The method of claim 1 wherein the substrate is stationary during deposition.

5. The method of claim 1 wherein the source is an ingot having a top surface, which is scanned by the electron beam.

6. The method of claim 5 wherein the ingot extends through a water cooled hearth.

7. The method of claim 1 wherein outgassing in the chamber provides the pressure of about $10^{-3}$ or less mm of Hg.

8. The method of claim 1 wherein the distance between the source and the substrate is at least 35 cm.

9. The method of claim 5 wherein the top surface is scanned by the electron beam to form a liquid ceramic pool thereon.

10. Method of making an oxide fuel cell electrolyte layer, comprising heating a substrate on which the oxide layer is to be deposited to a substrate temperature of about 1100° C. and above, impinging a surface of a source comprising the oxide with an electron beam in an evacuated chamber of without introducing process gas to evaporate the oxide in the chamber to form a liquid pool thereon from which oxide is evaporated, and depositing oxide on the heated substrate in the chamber where the oxide deposits on the heated substrate to form the oxide fuel cell electrolyte layer.

* * * * *

UNITED STATES PATENT AND TRADEMARK OFFICE
CERTIFICATE OF CORRECTION

| | | |
|---|---|---|
| PATENT NO. | : 7,763,371 B2 | Page 1 of 1 |
| APPLICATION NO. | : 11/099416 | |
| DATED | : July 27, 2010 | |
| INVENTOR(S) | : Kenneth S. Murphy | |

It is certified that error appears in the above-identified patent and that said Letters Patent is hereby corrected as shown below:

Column 8, line 37(Claim 10), remove "of" between "chamber" and "without".

Signed and Sealed this

Seventh Day of September, 2010

David J. Kappos
*Director of the United States Patent and Trademark Office*